(12) United States Patent
Bartling et al.

(10) Patent No.: US 11,658,671 B2
(45) Date of Patent: May 23, 2023

(54) LATENCY REDUCTION IN ANALOG-TO-DIGITAL CONVERTER-BASED RECEIVER CIRCUITS

(71) Applicant: Apple Inc., Cupertino, CA (US)

(72) Inventors: Ryan D. Bartling, Sunnyvale, CA (US); Jafar Savoj, Sunnyvale, CA (US); Brian S. Leibowitz, San Francisco, CA (US); Shah M. Sharif, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/482,322

(22) Filed: Sep. 22, 2021

(65) Prior Publication Data

US 2023/0093114 A1    Mar. 23, 2023

(51) Int. Cl.
*H03M 1/00* (2006.01)
*H03M 1/06* (2006.01)

(52) U.S. Cl.
CPC ....... *H03M 1/0687* (2013.01); *H03M 1/0626* (2013.01); *H03M 1/0648* (2013.01); *H03M 1/0663* (2013.01)

(58) Field of Classification Search
CPC .. H03M 1/1215; H03M 1/0836; H03M 1/001; H03M 1/007; H03M 1/0626; H03M 1/1033; H03M 1/12; H03M 1/125; H03M 1/1255; H03M 1/182; H03M 1/183; H03M 1/365; H03M 13/2951; H03M 13/4146; H04B 1/71055; H04B 10/2575; H04B 10/2581; H04B 10/504; H04B 10/5055; H04B 10/541; H04B 10/548; H04B 10/613; H04B 10/6162; H04B 10/6165; H04L 25/03885; H04L 1/006; H04L 25/0204; H04L 25/0224; H04L 25/03019; H04L 25/03057; H04L 25/03273; H04L 25/4917; H04L 27/02; H04L 27/2275; H04L 27/2637; H04L 27/2653; H04L 27/2697; H04L 27/34; H04L 43/028; H04L 7/0025; H04L 7/0029; H04L 7/0331; H04L 7/0334
USPC ................................ 341/139–142, 155, 159
See application file for complete search history.

(56) References Cited

U.S. PATENT DOCUMENTS

| 7,729,452 B2 * | 6/2010 | Agazzi | H04B 10/548 |
| | | | 714/792 |
| 8,654,898 B2 | 2/2014 | Bereza et al. | |
| 8,836,550 B2 * | 9/2014 | Snelgrove | H03M 1/1033 |
| | | | 341/120 |

(Continued)

FOREIGN PATENT DOCUMENTS

WO    2021088998 A1    5/2021

*Primary Examiner* — Linh V Nguyen
(74) *Attorney, Agent, or Firm* — Kowert, Hood, Munyon, Rankin & Goetzel, P.C.; Dean M. Munyon

(57) ABSTRACT

A serial data receiver circuit included in a computer system may include a front-end circuit, a sample circuit that includes multiple analog-to-digital converter circuits, and a recovery circuit. The front-end circuit may generate an equalized signal using multiple signals that encode a serial data stream of multiple data symbols. Based on a baud rate of the serial data stream, a determined number of the multiple analog-to-digital converter circuits sample, using a recovered clock signal, the equalized signal at the respective times to generate corresponding samples. The recovery circuit generates, using the samples, the recovered clock signal and recovered data symbols.

19 Claims, 14 Drawing Sheets

(56) References Cited

U.S. PATENT DOCUMENTS

| | | | |
|---|---|---|---|
| 9,209,825 B1 * | 12/2015 | Visani | H03M 1/0626 |
| 9,229,525 B2 | 1/2016 | Reller et al. | |
| 9,270,291 B1 * | 2/2016 | Parnaby | H04B 17/21 |
| 9,596,108 B2 | 3/2017 | Iyer et al. | |
| 9,762,423 B2 * | 9/2017 | Baecher | H04L 25/4917 |
| 10,277,230 B2 | 4/2019 | Liu et al. | |
| 10,483,952 B1 | 11/2019 | Su et al. | |
| 10,720,936 B1 * | 7/2020 | Xu | H03M 1/126 |
| 11,133,963 B1 * | 9/2021 | Zheng | H04B 1/123 |
| 2002/0064235 A1 * | 5/2002 | Svevar | H04L 27/0002 |
| | | | 375/295 |
| 2007/0230581 A1 * | 10/2007 | Orr | H04N 19/172 |
| | | | 375/E7.181 |
| 2008/0048897 A1 * | 2/2008 | Parthasarthy | H03M 1/0836 |
| | | | 341/122 |
| 2009/0031201 A1 * | 1/2009 | Das | H04L 1/0053 |
| | | | 714/E11.032 |
| 2010/0226421 A1 * | 9/2010 | Kibune | H03M 1/182 |
| | | | 375/229 |
| 2011/0235204 A1 * | 9/2011 | Yang | G11B 20/1816 |
| 2013/0107934 A1 * | 5/2013 | Zhou | H04L 25/03885 |
| | | | 375/232 |
| 2020/0374011 A1 * | 11/2020 | Zhou | H04B 10/6165 |

* cited by examiner

LATENCY REDUCTION IN ANALOG-TO-DIGITAL CONVERTER-BASED RECEIVER CIRCUITS

BACKGROUND

Technical Field

This disclosure relates to the field of high-speed communication interface design and, in particular, to reducing clock recovery latency.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel, and devices coupled to the communication channel, may induce reflections of the transmitted signal, which may degrade subsequently transmitted signals corresponding to other data bits.

SUMMARY OF THE EMBODIMENTS

Various embodiments for reducing latency in the recovery of data symbols from a serial data stream are disclosed. Broadly speaking, a front-end circuit is configured to generate an equalized signal using a plurality of signals that encode a serial data stream that includes a plurality of data symbols. A sample circuit includes a plurality of analog-to-digital converter circuits, and a subset of the plurality of analog-to-digital converter circuits are configured to sample, using a recovered clock signal, the equalized signal during respective time periods to generate corresponding sets of samples. The number of analog-to-digital converter circuits included in the subset can be based on a baud rate of the serial data stream. A recovery circuit is configured to generate, using the set of samples, the recovered clock signal and a plurality of recovered data symbols.

DETAILED DESCRIPTION OF EMBODIMENTS

Figure 1:
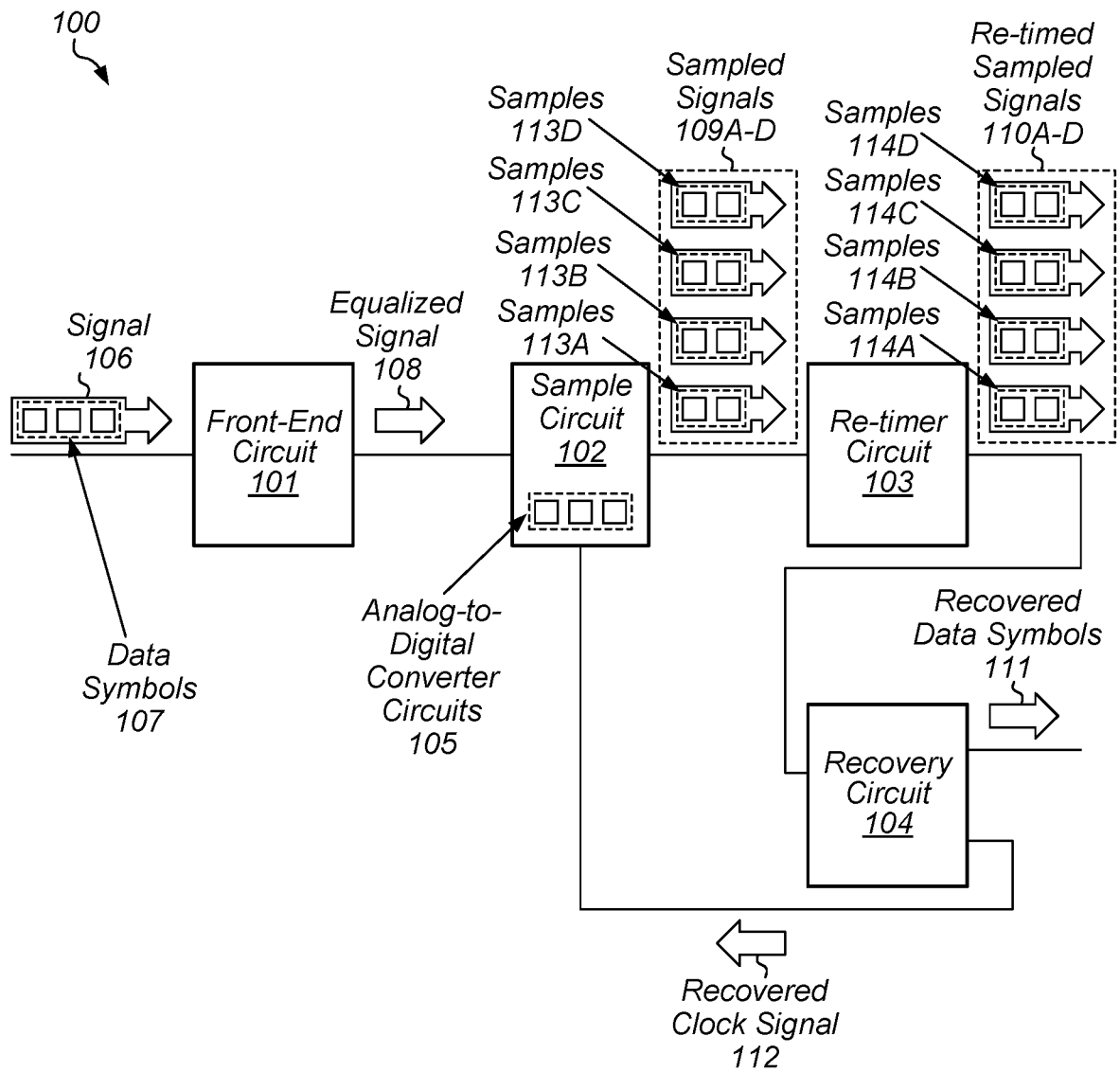
FIG. 1 is a block diagram of an embodiment of a receiver circuit for a computer system.

A computing system may include one or more integrated circuits, such as, e.g., a central processing unit (CPU) and memories. Various integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using a return to zero (RZ) protocol, non-return to zero (NRZ) protocol, pulse amplitude modulation (PAM), or any suitable combination thereof.

Serial data streams are often transmitted without an accompanying clock signal. In such cases, a clock signal is recovered from the serial data stream (in a process referred to as "clock recovery") and used for sampling the serial data stream to determine the values of the included data symbols. Various techniques can be employed to recover a clock signal. For example, a receiver circuit may generate a clock signal whose frequency is approximately the same as that of a clock signal used to create the data stream. A phase-locked loop circuit may then be used to phase align the clock signal with transitions in the serial data stream. Alternatively, the serial data stream may be oversampled, i.e., sampled at a higher frequency than that of the clock signal used generate the serial data stream.

The process of recovering a clock signal from a serial data stream is invariably imperfect, resulting in the edges of the clock signal deviating from their ideal positions. This deviation in the clock edges is referred to as "jitter" and can be the result of various effects within a circuit, such as power supply noise, thermal noise, ground bounce, and the like.

One source of jitter in clock recovery circuits is the latency of a proportional path within such clock recovery circuits. Many clock recovery circuits include tunable oscillator circuit with dual control loop. One of the control loops uses integrated phase error information (referred to as the "integral path"), while the other control loop directly uses the phase error information (referred to as the "proportional path"). For a given interconnect standard, increases in the latency in the proportional path can result in jitter peaking near the frequency at which the control loops begin to attenuate the frequencies associated with jitter (referred to as the "jitter tolerance corner frequency") resulting in additional jitter in the recovered clock signal. Jitter in a recovered clock signal can result in incorrect sampling of the serial data stream, resulting in the misidentification of data symbols in the serial data stream. As such, in many interconnect standards, a maximum amount of jitter is specified in order to ensure proper operation of the interconnect.

Receiver circuits for serial data streams may be analog based, or they may employ analog-to-digital converter (ADC) circuits. ADC-based receiver circuits convert an equalized version of input data signals into bits in the digital domain, allowing additional processing (e.g., feed-forward equalization) to be performed as digital signal processing operations.

In new interconnect standards, receiver circuits are often required to support a wide range of data rates. For example, in peripheral component interconnect express (PCIE), the data rates can vary from 2.5 Gbaudps to 32 Gbaudps. As the baud rate (symbols per second) of the serial data stream decreases, it can take longer to sample enough data to recover the clock signal embedded in the serial data stream. This problem can be more pronounced in an ADC-based receiver circuit, where the time for an ADC circuit to resolve a given sample can increase the latency in proportional path for the oscillator circuit in the clock recovery circuit, resulting in additional jitter.

The embodiments illustrated in the drawings and described below provide techniques for reducing clock recovery latency in ADC-based receiver circuits by using multiple ADC circuits that sample at corresponding times. By reducing clock recovery latency, ADC-based receiver circuits can achieve desired jitter tolerance goals when operating at low baud rates.

A block diagram depicting an embodiment of a receiver circuit is illustrated in FIG. 1. As illustrated, receiver circuit 100 includes front-end circuit 101, sample circuit 102, re-timer circuit 103, and recovery circuit 104.

Front-end circuit 101 is configured to generate equalized signal 108 using signal 106. In some embodiments, signal 106 encodes a serial data stream that includes data symbols 107. In various embodiments, signal 106 may encode data symbols 107 according to one of various symbol encodings. For example, signal 106 may be transmitted according to RZ, NRZ, PAM3, or any other suitable symbol encodings.

Sample circuit 102 includes analog-to-digital converter circuit 105. A subset of analog-to-digital converter circuits 105 are configured to sample, using recovered clock signal 112, equalized signal 108 during respective time periods to generate corresponding sampled signals 109A-D. It is noted that although only four sample signals are depicted in FIG. 1, in other embodiments, any suitable number of analog-to-digital converter circuits can be employed, resulting in a corresponding number of sample signals.

In various embodiments, a number of analog-to-digital converter circuits activated may be based on a baud rate of the serial data stream that includes data symbols 107. For example, higher baud rates can result in a larger number of analog-to-digital converter circuits to be activated. As used and defined herein, baud rate is a rate at which symbols are transmitted via a communication channel. For example, the baud rate associated with signal 106 corresponds to a rate at which individual ones of data symbols 107 arrive at front-end circuit 101.

With multiple analog-to-digital converter circuits operating in rapid succession, sampled signals 109A-D may be generated sequentially at the arrival frequency of data symbols 107. It is noted that each of sampled signals 109A-D carry corresponding streams of samples 113A-D, respectively. Such an arrival frequency may be too high for recovery circuit 104 to process. In such cases, a re-timer circuit, such as re-timer circuit 103, may adjust the timing of sampled signals 109. Re-timer circuit 103 is, in various embodiments, configured to generate re-timed sampled signals 110A-D using sampled signals 109A-D. It is noted that each of re-timed sampled signals 110A-C carry corresponding streams of samples 114A-D, respectively. In some cases, the re-timed sampled signals 110A-D may be timed to a single clock phase, while sampled signals 109A-D may be time to different interleaved clock phases. In some cases, a frequency of re-timed sampled signals 110A-D is less than a frequency of sampled signals 109A-D.

Recovery circuit 104 is configured to generate recovered data symbols 111 and recovered clock signal 112 using re-timed sampled signals 110A-D. As described below, to generate recovered data symbols 111 and recovered clock signal 112, recovery circuit 104 may be further configured to perform additional equalization operations (e.g., feed-forward equalization) using re-timed sampled signals 110. Since a given one of sampled signals 109A-D includes multiple bits whose values collectively correspond to a voltage level of signal 106 at a given point in time, recovery circuit 104 can perform its functions in the digital domain. In various embodiments, portions of recovery circuit 104 may be implemented using digital signal processing (DSP) techniques.

Since recovery circuit 104 relies on re-timed sampled signals 110A-D to generate recovered clock signal 112, the longer the latency in generating sampled signals 109A-D from signal 106, the larger the opportunity for recovered clock signal 112 drift in frequency. By adjusting a number of active analog-to-digital converter circuits in sample circuit 102 based on the baud rate of data symbols 107, the latency in generating sampled signals 109A-D can be reduced, which can reduce jitter in recovered clock signal 112.

While decimating the operation of the analog-to-digital converter circuits can reduce the latency, other techniques may be employed to further reduce the latency in order to improve the performance. Such techniques can include the use of serialization to combine the multiple streams of data from respective ones of the analog-to-digital converter circuits into one or more serialized data streams. Such serialized data streams can include samples generated by different ones of the analog-to-digital converter circuits.

Figure 2:
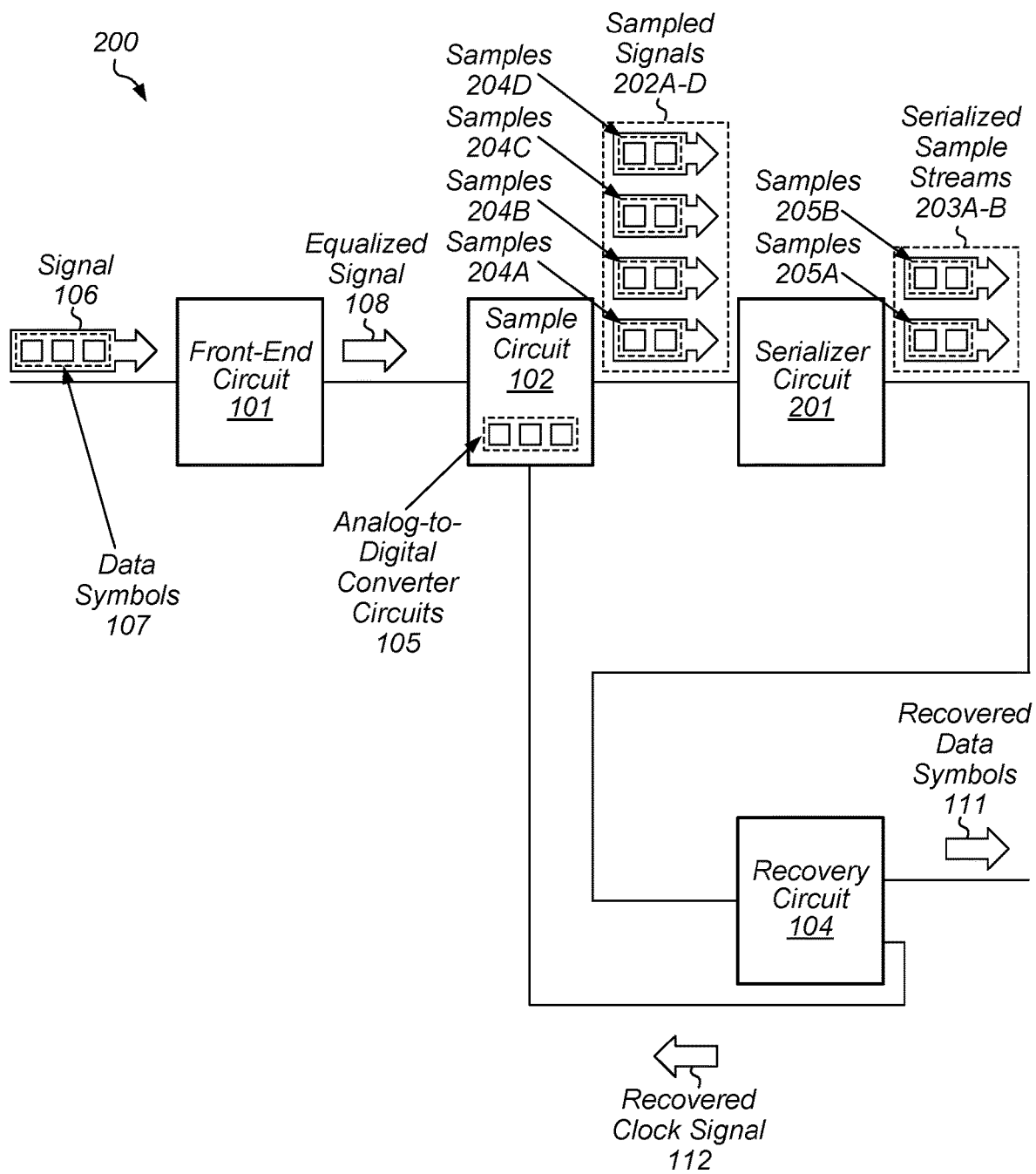
FIG. 2 is a block diagram of another embodiment of a receiver circuit for a computer system.

Turning to FIG. 2, a block diagram of an embodiment of a receiver circuit that employs a serializer circuit is depicted. As illustrated, receiver circuit 200 includes front-end circuit 101, sample circuit 102, re-timer circuit 103, recovery circuit 104, and serializer circuit 201.

As described above, front-end circuit 101 is configured to generate equalized signal 108 using signal 106, and sample circuit 102 is configured to generate sampled signals 202A-D using equalized signal 108. It is noted that each of sampled signals 202A-D carry corresponding streams of samples 204A-D, respectively.

In various embodiments, sample circuit 102 may be configured to generate sampled signals 202A-D such that a given one of samples 204A may be out of phase with the samples included in samples 204B-D. For example, symbols in samples 202B may lag the symbols in samples 202A. The lag may be based on phase differences in clock signals that drive analog-to-digital converter circuits 105. It is noted that although only four sampled signals are depicted in FIG. 2, in other embodiments, any suitable number of analog-to-digital converter circuits can be employed, resulting in a corresponding number of sampled signals.

Different numbers of clock signals (or phase) may be used in conjunction with sampled signals 202A-D. In some embodiments, each of sampled signals 202A-D may be aligned with a corresponding clock phase. Alternatively, groups of sampled signals 202A-D may be aligned to correspond clock phases. For example, sampled signals 202A and 202B may be aligned with a first clock phase, while sampled signals 202C and 202D may be aligned to a second clock phase.

Serializer circuit 201 is configured to generate serialized sample streams 203A and 203B using sampled signals 202A-D. It is noted that serialized samples streams include corresponding streams of samples 205A-B, respectively. In various embodiments, to generate serialized sample streams 203A and 203B, serializer circuit 201 is configured to combine different samples of samples 204A-D to generate serialized sample streams 203A and 203B. Although only two serialized sample streams are depicted in the embodiment of FIG. 2, in other embodiments, any suitable number of serialized sample streams may be generated. In some embodiments, a number of serialized sample streams generated may be based on a baud rate of data symbols 107.

In some embodiments, serializer circuit 201 may be configured to select corresponding samples from representative ones of a particular subset of samples 202A-202D and combine them, in a serial fashion, to create serialized sample stream 203A. In a similar fashion, serializer circuit 201 is further configured to select different corresponding samples from respective ones of a different subset of samples 202A-D, to create serialized sample stream 203B. The number of samples in a subset of samples 202A-D to be included in a given serialized sample stream is referred to as the "serialization ratio" and may, in various embodiments, be inversely proportional to changes in the baud rate of data symbols 107. It is noted that, in some embodiments, serializer circuit 201 may be further configured to perform a re-timing operation as part of generating serialized sample streams 203A-B.

As described above, different ones of sampled signals 202A-D may be aligned to different clock phases. As such, samples from one or more of sampled signals 202A-D may be available for use by recovery circuit 104 before samples from other ones of sampled signals 202A-D. By serializing available samples from the one or more of sampled signals 202A-D, serializer circuit 201 can provide a portion of samples 204A-D to recovery circuit 104, while the remaining portion of samples 204A-D are still being resolved. Since recovery circuit 104 is able to start processing of the earlier available symbols earlier in time the likelihood of drift due to jitter in recovered clock signal 112 is reduced.

Recovery circuit 104 is configured to generate recovered data symbols 111 and recovered clock signal 112 using serialized sample signals 203A-B. As described below, recovery circuit 104 may perform various operations (e.g., feed forward equalization) to generate recovered data symbols 111. In some cases, recovery circuit 104 may operate on multiple symbols in parallel. In such cases, recovery circuit 104 may wait until a particular number of samples have been received from either serialized sample stream 203A or serialized sample stream 203B have been received before performing certain ones of various clock data recovery operations.

Figure 3:
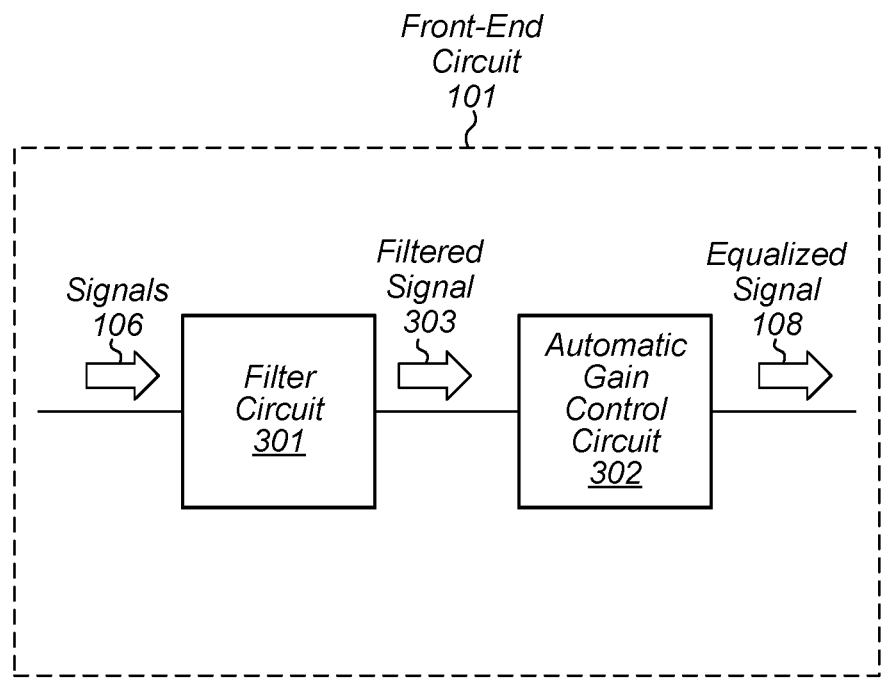
FIG. 3 is a block diagram of an embodiment of an analog front-end circuit.

As described above, front-end circuit 101 is configured to generate equalized signal 108. A block diagram of an embodiment of front-end circuit 101 is depicted in FIG. 3. As illustrated, front-end circuit 101 includes filter circuit 301 and automatic gain control circuit 302. It is noted that although front-end circuit 101 is depicted as being implemented using continuous-time linear equalization techniques, in other embodiments, other equalization techniques may be employed.

Filter circuit 301 is configured to generate filter signal 303 using signal 106. In various embodiments, to generate filter signal 303, filter circuit 301 may be further configured to attenuate high-frequency noise in signal 106. In some cases, filter circuit 301 may be further configured to attenuate low-frequency components at or near DC levels in signal 106.

In various embodiments, filter circuit 301 may be implemented using a series of filter circuits, each with different transfer functions. For example, filter circuit 301 may include three filter circuits. The first filter circuit may be a high-pass filter circuit, while the second and third filters circuits may be bandpass filter circuits. In some embodiments, filter circuit 301 may additionally include a variable gain amplifier circuit coupled to the output of the last of the three filter circuits.

Automatic gain control circuit 302 is configured to generate equalized signal 108 using filtered signal 303. In various embodiments, automatic gain control circuit 302 may be implemented as a closed-loop control circuit that uses feedback derived from equalized signal 108 to maintain the amplitude of the data symbols at an optimum level for sampling. In various embodiments, automatic gain control circuit 302 may include any suitable combination of attenuator and amplifier circuits that can be dynamically activated or de-activated to maintain the amplitude of the data symbols.

It is noted that although front-end circuit 101 is depicted as including filter circuit 301 and automatic gain control circuit 302, when different equalization techniques are employed, different and/or additional circuit blocks may be included.

Figure 4:
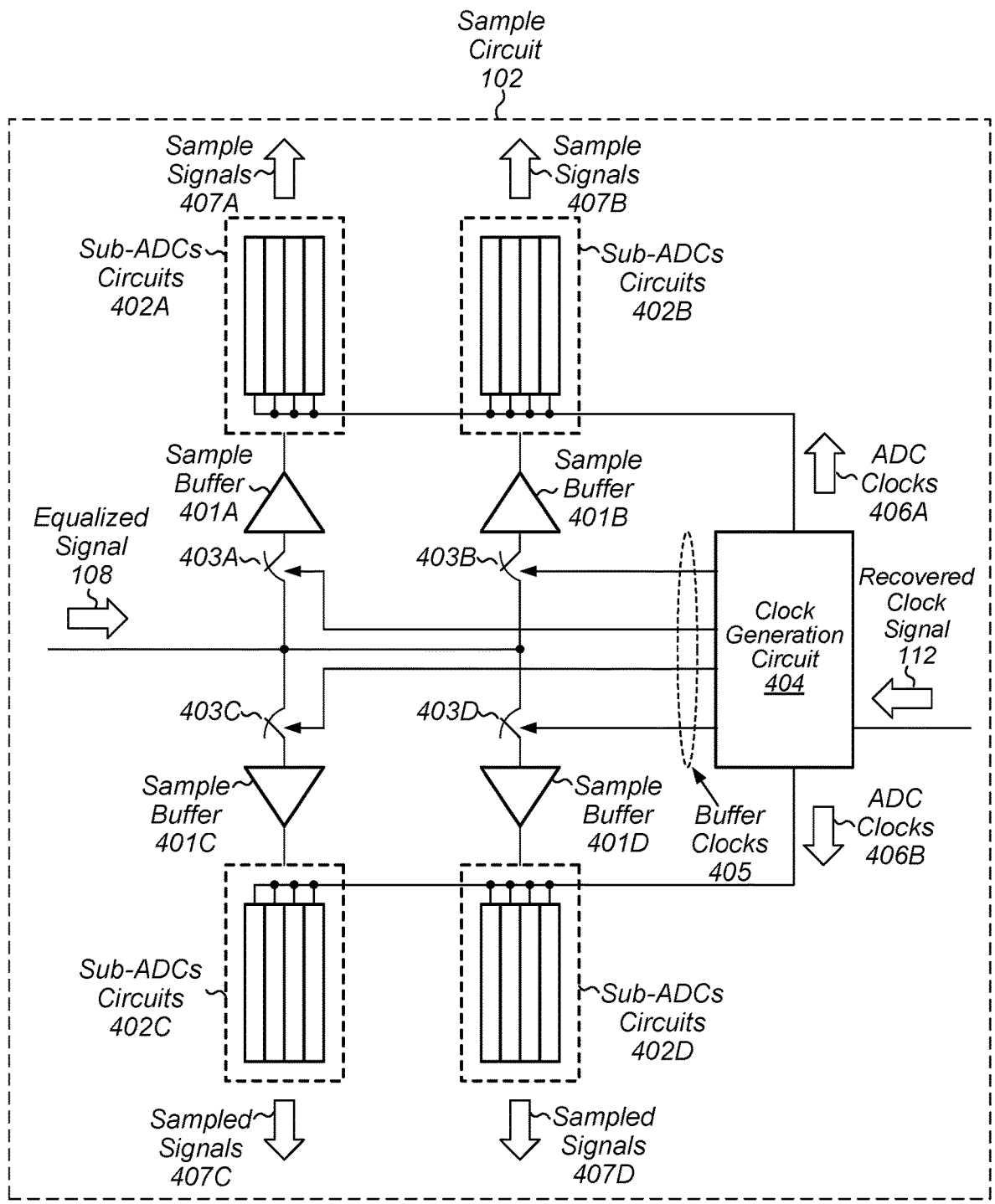
FIG. 4 is a block diagram of an embodiment of a sample circuit that employs multiple analog-to-digital converter circuits.

Turning to FIG. 4, an embodiment of sample circuit 102 is depicted. As illustrated, sample circuit 102 includes sample buffers 401A-401D, sub-analog-to-digital converter circuits (denoted as "sub-ADCs 402A-402D"), switches 403A-403D, and clock generation circuit 404. It is noted that although four sample buffers, four switches, and four sub-ADCs are depicted in the embodiment of FIG. 4, in other embodiments, different numbers of sample buffers, switches, and sub-ADCs may be employed.

Switches 403A-403D are configured to couple, using buffer clocks 405, equalized signal 108 to corresponding ones of sample buffers 401A-401D. In various embodiments, each of buffer clocks 405 may be phase shifted from each other such that only one of switches 403A-403D is closed at any given time. The respective frequencies of buffer clocks 405 may, in various embodiments, be based on a frequency of recovered clock signal 412, as well as the number of sample buffers and sub-ADCs included in sample circuit 102.

Switches 403A-403D may, in various embodiments, be implemented using one or more switch metal-oxide semiconductor field-effect transistors (MOSFETs), fin field-effect transistors (FinFETs), gate-all-around field-effect transistors (GAAFETs), or any other suitable switching device.

Each of sample buffers 401A-401D are configured to buffer equalized signal 108 and to drive the analog-to-digital converter circuits included in corresponding ones of sub-ADCs 402A-402D. In various embodiments, sample buffers 401A-401D may be implemented as unity-gain amplifier circuits, or any other suitable circuit configured to buffer an analog signal and provide additional drive to allow for driving multiple analog-to-digital converter circuits.

Each of sub-ADCs 402A-402D includes multiple analog-to-digital circuits coupled to a corresponding one of sample buffers 401A-401D and configured to generate sampled signals 407A-407D based on a voltage level of the outputs of the corresponding one of sample buffers 401A-401D. As described above in regard to sampled signals 109A-D, each of sampled signals 407A-407D may carry corresponding streams of symbols generated by corresponding ones of sub-ADCs 402A-402D. The analog-to-digital circuits included in a given one of sub-ADCs 402A-402D are activated in sequence by ADC clocks 406A and 406B.

When a given analog-to-digital converter circuit is activated, it samples the output of its corresponding sample buffer. Once the output has been sampled, there may be a period of time (referred to as a "resolution period" or a "resolve period") for the analog-to-digital converter circuit to generate multiple bits whose value corresponds to the voltage level of the sampled output. The duration of the resolution period and the number of bits generated vary with the type of analog-to-digital circuit employed. In various embodiments, the total of the sample and resolution periods for the analog-to-digital converter circuits included in a given sub-ADC may be less than or equal to an active time of a corresponding one of buffer clocks 405.

The individual analog-to-digital converter circuits included in sub-ADCs 402A-402D may be implemented as flash ADCs, successive-approximation ADCs, or any other suitable type of analog-to-digital converter circuit. Although only four ADCs are depicted as being included in sub-ADCs 402A-402D, in other embodiments, any suitable number of analog-to-digital converter circuits can be employed. In such cases, clock generator circuit 404 would be configured to generate the necessary number of ADC clock signals.

Clock generator circuit 404 is configured to generate buffer clocks 405 and ADC clocks 406A and 406B. In various embodiments, clock generator circuit 404 may be implemented using phase-locked loop circuits, delay-locked loops circuits, delay circuits, or any other type of circuit suitable for generating multiple clock signals with different phases.

Figure 5:
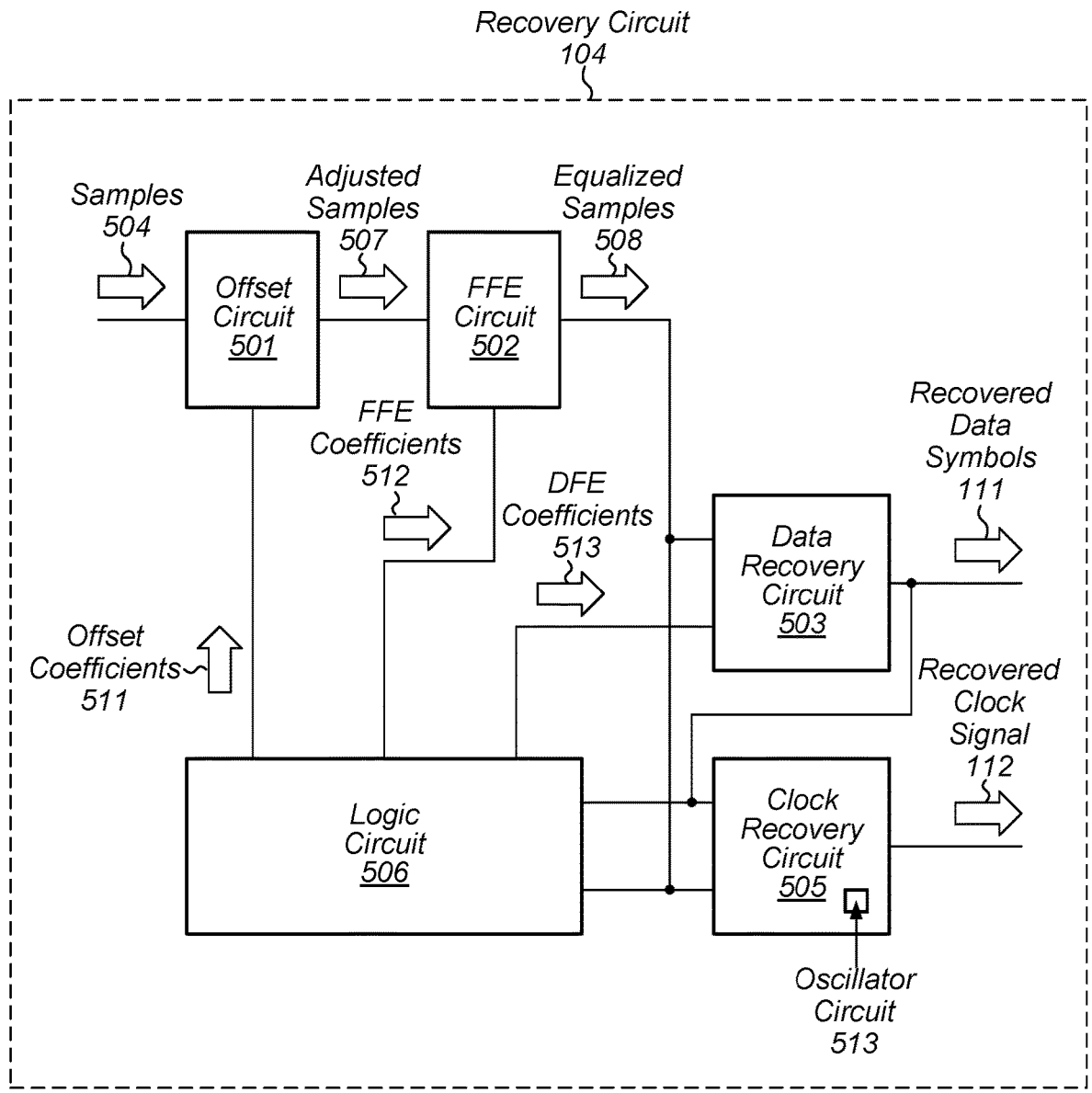
FIG. 5 is a block diagram of an embodiment of a recovery circuit.

Turning to FIG. 5, a block diagram of recovery circuit 104 is depicted. As illustrated, recovery circuit 104 includes offset circuit 501, a feed-forward equalization circuit (denoted as "FFE circuit 502"), data recovery circuit 503, clock recovery circuit 505, and logic circuit 506.

Offset circuit 501 is configured to generate, using offset coefficients 511, adjusted samples 507 using samples 504. In it noted that, in various embodiments, samples 504 may correspond to samples 114A-D included in re-timed samples signals 110A-D, while in other embodiments, samples 504 may correspond to samples 205A-B included in serialized samples streams 203A-B. In various embodiments, samples 504 may include mismatch due to manufacturing variability across different ones of sub-ADCs 402A-402D. To correct for the mismatch, offset circuit 501 may be configured to add, based on offset coefficients 511, an offset to each sample as well as multiply each sample by a gain factor specified offset coefficients 511. It is noted that in cases where a serializer circuit (e.g., serializer circuit 201) exists, operations to correct mismatch may be performed prior to serialization in order to correct samples before they are serialized. In some embodiments, offset circuit 501 may also perform a saturation function to prevent any of adjusted samples 507 going out-of-range during the adjustment process.

FFE circuit 502 is configured to perform a feed-forward equalization operation on adjusted samples 507 using FFE coefficients 512 to generate equalized samples 508. FFE circuit 502 may be configured to generate delayed versions of adjusted samples 507. FFE circuit 502 may be further configured to combine the delayed versions of adjusted samples 507 according to coefficients 511 to generate equalized samples 508. It is noted that there are numerous techniques by which feed-forward equalization may be performed and, in various embodiments, FFE circuit 502 may be configured to employ any suitable technique. In various embodiments, FFE circuit 502 may be implemented as a digital finite impulse response (FIR) filter.

Data recovery circuit 503 is configured to generate recovered data symbols 111 using equalized samples 508 and DFE coefficients 513. In various embodiments, data recovery circuit 503 is may be configured to perform a decision-feedback equalization operation as part of generating recovered data symbols 111. It is noted that there are numerous techniques by which data symbols can be recovered from equalized samples 508 and that, in various embodiments, data recovery circuit may be configured to employ any suitable technique for data recovery.

Clock recovery circuit 505 includes oscillator circuit 513 and is configured to generate recovered clock signal 112 using equalized samples 508 and recovered data symbols 111. In various embodiments, oscillator circuit 513 is a voltage-controlled oscillator circuit that has two control ports. A signal for one of the control ports is adjusted in response to changes in phase error indications derived from equalized samples 508 and recovered data symbols 111. This control path is referred to as a "proportional" path. In other embodiments, oscillator circuit 513 may include a single control port and information corresponding to both the proportional path and an integral path may be combined for use with the single control port. It is noted that, depending on the frequency of the signal generated by oscillator circuit 513, a frequency divider circuit may be employed.

Logic circuit 506 is configured to generate offset coefficients 511, FFE coefficients 512, and DFE coefficients using recovered data symbols 111 and equalized signals 508. For example, in some embodiments, logic circuit 506 may be configured to adapt FFE, DFE, and offset coefficients utilizing a least mean square (LMS) algorithm or any suitable adaptation algorithm.

It is noted that the embodiment of recovery circuit 104 depicted in FIG. 5 is merely an example. In other embodiments, different circuit blocks and different arrangement of circuit blocks are possible and contemplated. For example, in some cases, feed-forward equalization may be omitted, or differently adjusted samples may be used for data recovery and clock recovery circuits.

Figure 6:
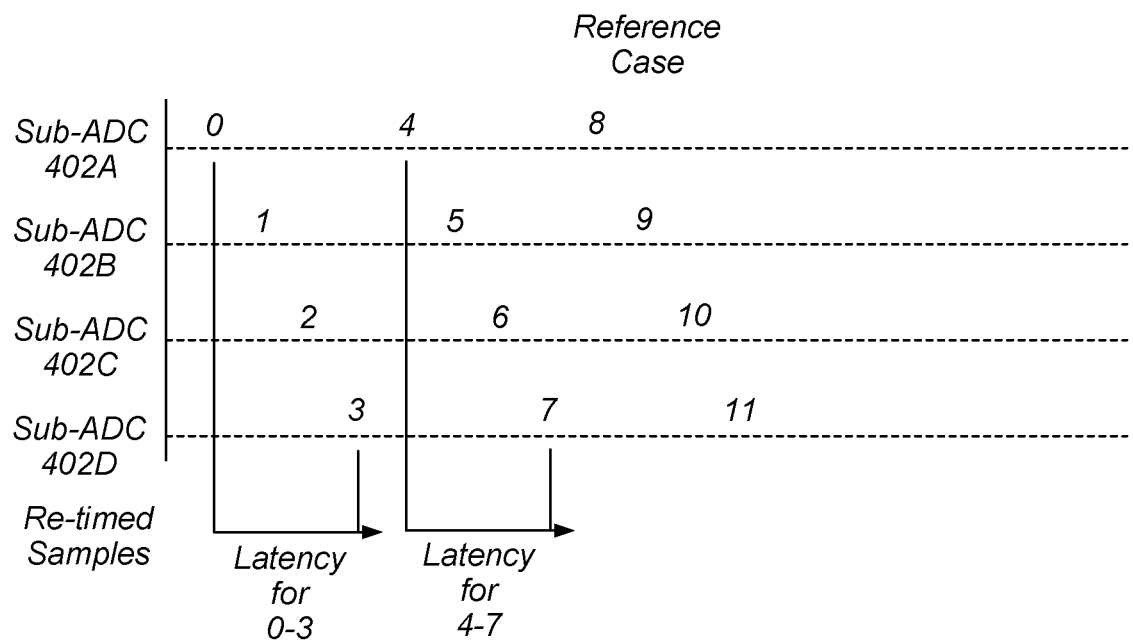
FIG. 6 is a diagram depicting a change latency of a receiver circuit in response to a change in the baud rate of received symbols.
Figure 6:
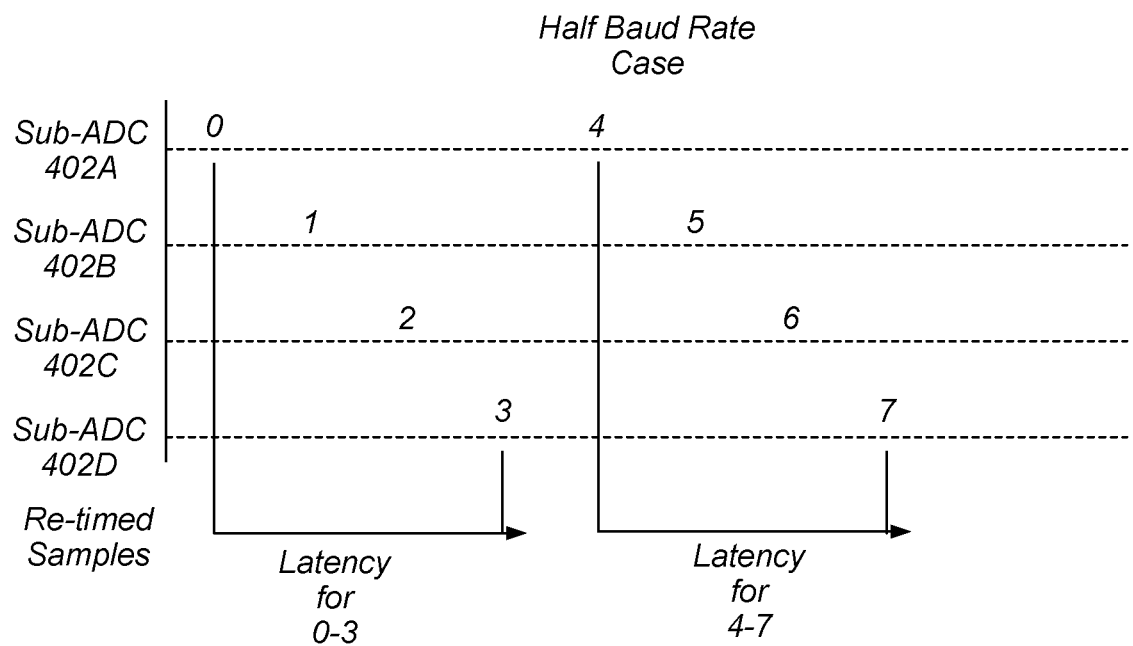

Turning to FIG. 6, a diagram depicting a change of latency of a receiver circuit in response to a change in the baud rate of received symbols is illustrated. The diagram depicts four sub-ADCs sampling data symbols with a particular baud rate, and sampling the data symbols when the baud rate of data symbols is reduced by half.

In the reference case, sub-ADC 402A samples symbol 0 at particular time. In succession, sub-ADCs 402B-D sample symbols 1-3 at corresponding times. Once sub-ADC 402D has sampled symbol 3, sub-ADC 402A can then sample symbol 4 at the next time point. Sub-ADCs 402B-D then, in succession, sample symbols 5-7 at corresponding times. The process then repeats with sub-ADCs 402A-D sampling symbols 8-11 at corresponding times.

The latency to generate samples for symbols 0-3 corresponds to the time for each of sub-ADCs 402A-D to sample and resolve their respective samples of the input data symbols. This may, in various embodiments, be the minimum latency to generate a set of samples that can be processed by a recovery circuit such as recovery circuit 104.

In the half baud rate case, the baud rate of the input data symbols has been reduced by half. The operation of sub-ADCs 402A-D is similar to the reference case, although the sampling frequency of each one of sub-ADCs 402A-D is half that of the reference case. In this case, the latency to generate samples corresponding to symbols 0-3 (and symbols 4-7) is twice that of the reference case, resulting recovery circuit 104 operating at a reduced frequency as well. As described above, the increase in latency can result in undesirable jitter in recovered clock signal 112.

Figure 7:
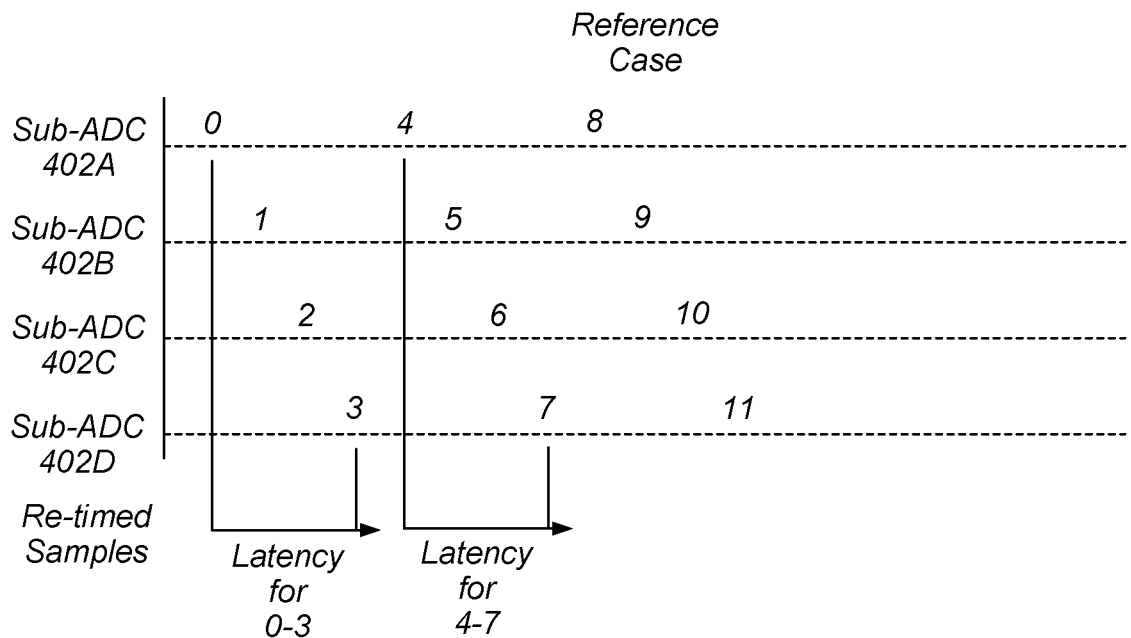
FIG. 7 is a diagram depicting the use of decimating to reduce latency in a receiver circuit resulting from a decrease in the baud rate of received symbols.
Figure 7:
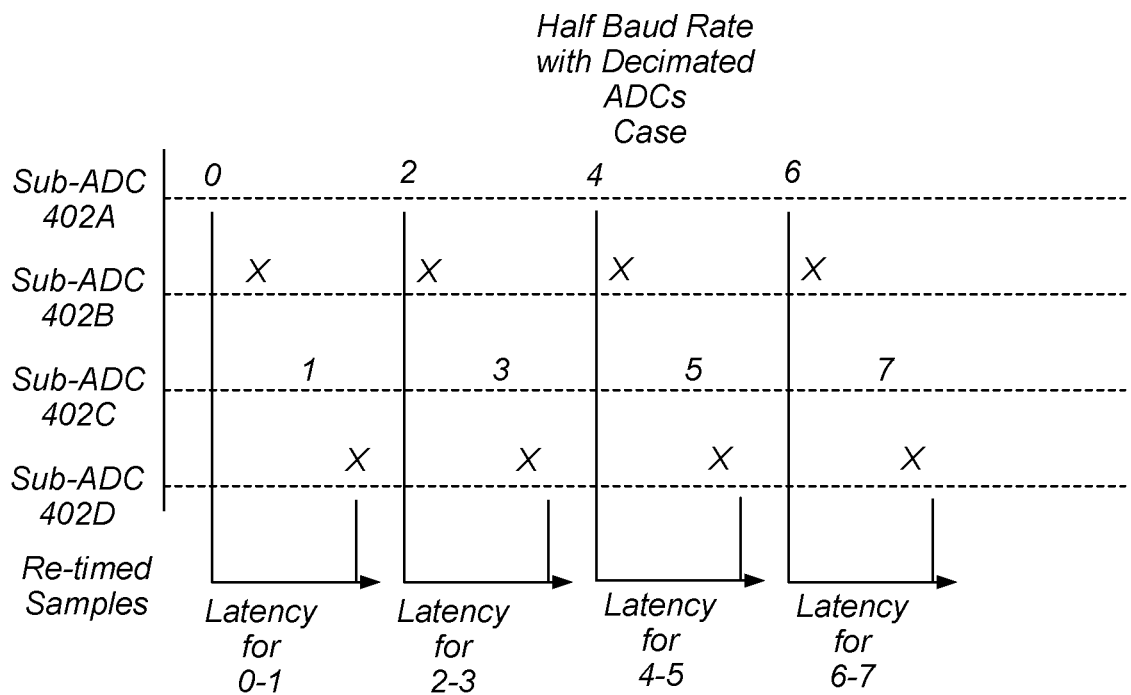

As noted above, different techniques may be employed to reduce an increase in latency in generating samples resulting from a reduction in the baud rate of input data symbols. Turning to FIG. 7, is a diagram depicting the use of decimating ADCs to reduce latency in a receiver circuit resulting from a decrease in the baud rate of received symbols is illustrated.

For the purposes of comparison, the reference case is illustrated again. In the half baud rate with the decimation case, a subset of sub-ADCs 402A-D are activated rather than all of sub-ADCs 402A-D. As illustrated, sub-ADCs 402A-B are used for sampling, while sub-ADCs 402C-D are left inactive.

At an initial time, sub-ADC 402A samples symbol 0, and at a later time, based on the reduced baud rate of the input data symbols, sub-ADC 402C samples symbol 1. Once symbol 1 has been sampled by sub-ADC 402C, sub-ADC 402A samples the input data symbols to generate a sample corresponding to symbol 2. The process continues with sub-ADCs 402A/C alternating their sampling of the input data symbols to generate samples for symbols 3-7. It is noted that the sampling frequency for sub-ADCs 402A/C is the same as for the reference case.

In this case, the latency to generate a set of samples is governed by the time required for sub-ADCs 402A/C to sample and resolve two samples. Compared to the reference case, the latency for symbols 0-1 is equal to the latency for symbols 0-3 in the reference case, but only samples for two symbols are included in the set of samples sent to recovery circuit 104, which can operate at the same frequency as in the reference case. It is noted that there is no need to resolve the samples corresponding to disabled sub-ADCs. It is possible and contemplated that the ADC sampling latency can be reduced relative to the reference case by adjusting the phase of clocks interfacing with the re-timer logic as the baud rate of the serial data stream changes. With the increase in latency mitigated by disabling some of the sub-ADCs, there is no additional jitter introduced into recovered clock signal 112 due to the decrease in the baud rate of the input data symbols.

Figure 8:
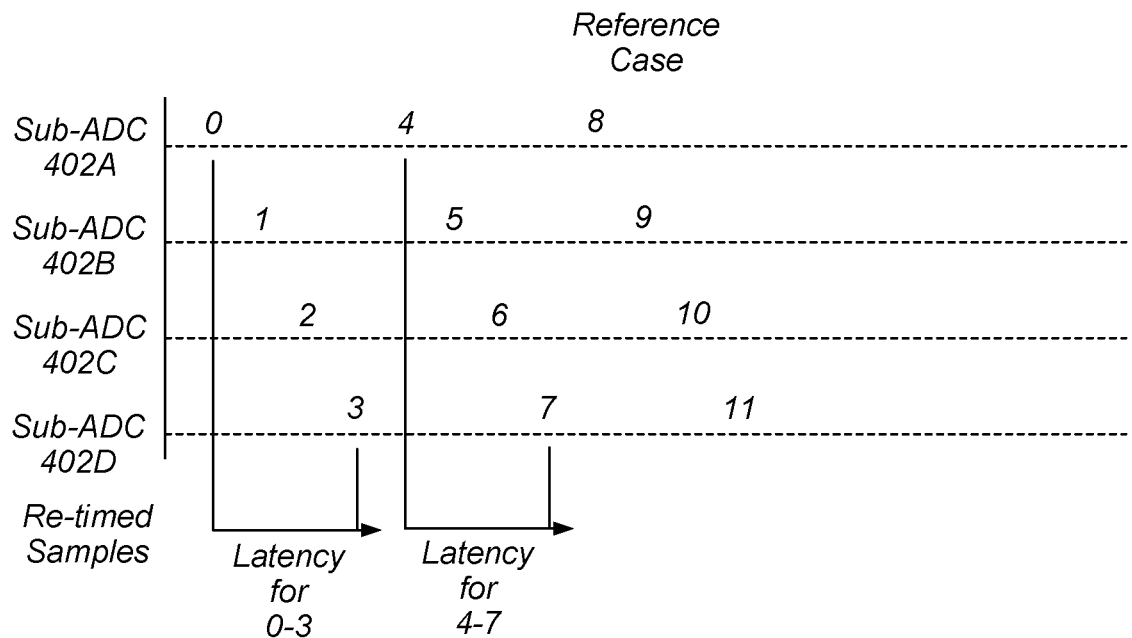
FIG. 8 is a diagram depicting the use of serialization to reduce latency in a receiver circuit resulting from a decrease in the baud rate of received data symbols.
Figure 8:
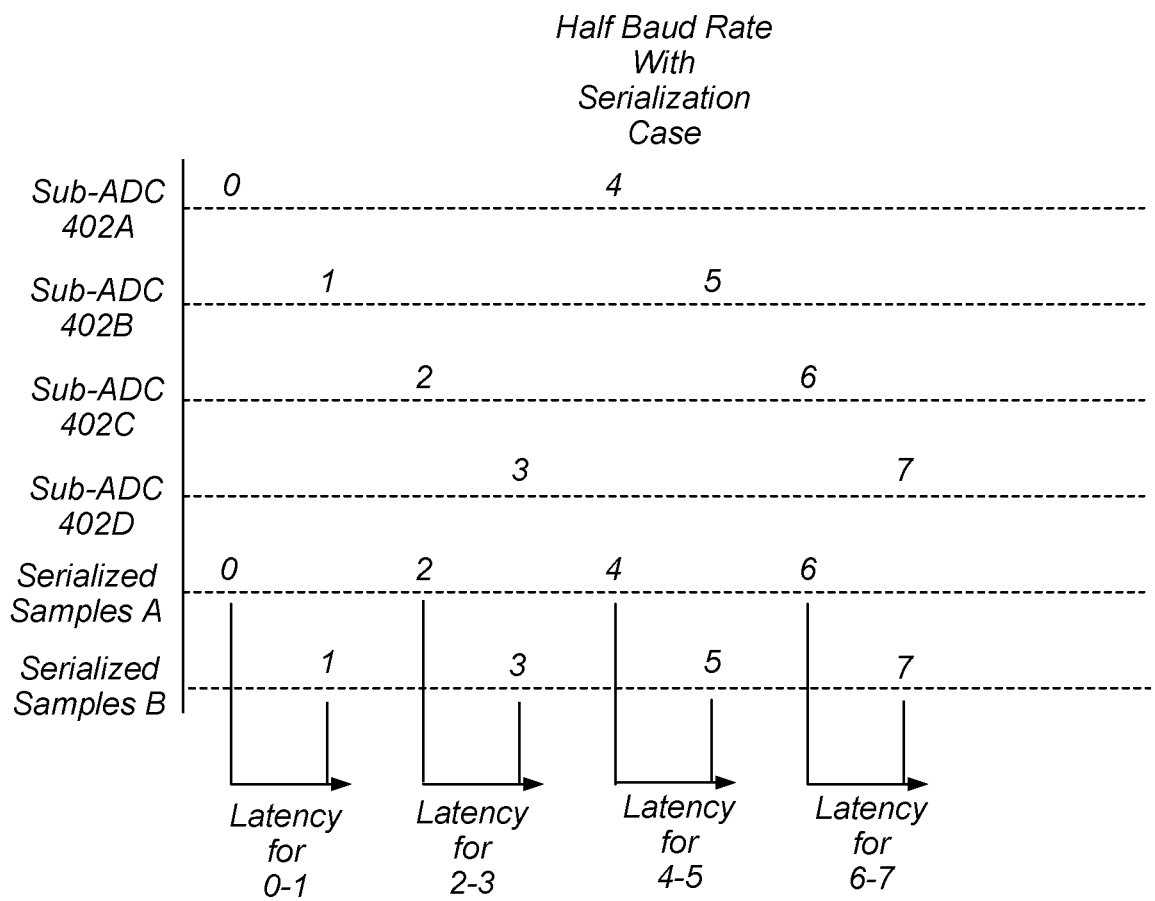

Using only some of the sub-ADCs is just one technique for reducing in increase in latency in generating samples resulting from the baud rate of the input data symbols decreasing. Turning to FIG. 8, a diagram depicting the use of serialization to reduce latency in a receiver circuit resulting from a decrease in the baud rate of received data symbols is illustrated.

For the purposes of comparison, the reference case is illustrated again. In the half baud rate with serialization case, all of sub-ADCs 402A-D are active, but their respective sampling frequencies are half of that of the reference case. Starting with sub-ADC 402A, each of sub-ADCs 402A-D sample the input data symbols at corresponding times to generate samples corresponding to symbols 0-3. The process then repeats, starting with sub-ADC 402A, to generate samples corresponding to symbols 4-7.

In this case, serializer circuit 201 combines the samples generated by different ones of sub-ADCs 402A-D to generate serialized samples A and serialized samples B. It is noted that serialized samples A and serialized samples B may correspond to serialized sample streams 203A-B, respectively. In particular, serializer circuit 201 adds the sample for symbol 0 to serialized samples A as soon as the sample has resolved. In a similar fashion, serializer circuit 201 adds the sample for symbol 1 to serialized sample B as soon as the sample has resolved.

The process continues with serializer circuit 201 adding the sample for symbol 2 to serialized samples A, and adding the sample for symbol 3 to serialized samples B. As sampling continues, serializer circuit 201 continues to add samples from sub-ADCs 402A and 402C to serialized samples A, and continues to add samples from sub-ADCs 402B and 402D to serialized samples B. The number of sub-ADCs used to create a set of serialized samples may be based on the baud rate of the input data symbols.

Recovery circuit 104 is able to operate at the same frequency as in the reference case by using both serialized samples A and serialized samples B. The latency to provide symbols 0-1 is less than the latency for symbols 0-3 in the reference case, but only samples for only two symbols are processed at a by recovery circuit 104. It is noted that design implementation, such as the choice of clock stimulating serializer circuit 201 for a given baud rate, may impact an actual amount of latency reduction. With the increase in latency mitigated by serializing the outputs of the sub-ADCs to generate multiple serialized symbols streams, there is no additional jitter introduced into recovered clock signal 112 due to the decrease in the baud rate of the input data symbols.

Figure 9:
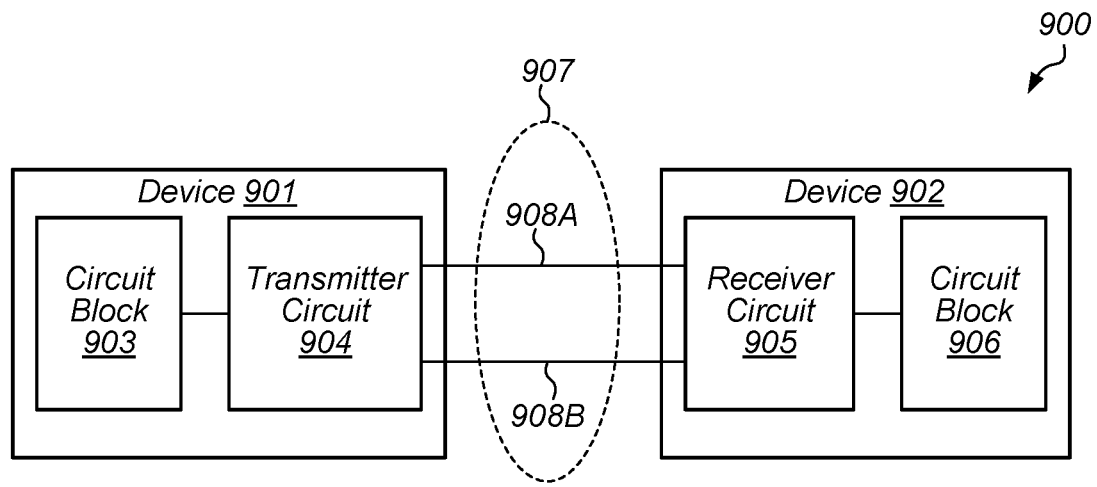
FIG. 9 is a block diagram of a computer system that includes a transmitter circuit and a receiver circuit.

As described above, a receiver circuit, such as receiver circuit 100, may be employed in a computer system. A block diagram of an embodiment of such a computer system is depicted in FIG. 9. As illustrated, computer system 900 includes devices 901 and 902, coupled by communication bus 707.

Device 901 includes circuit block 903 and transmitter circuit 904. In various embodiments, device 901 may be a processor circuit, a processor core, a memory circuit, or any other suitable circuit block that may be included on an integrated circuit in a computer system. It is noted that although device 901 only depicts a single circuit block and a single transmitter circuit, in other embodiments, additional circuit blocks and additional transmitter circuits may be employed.

Transmitter circuit 904 is configured to serially transmit signals, via communication bus 907, corresponding to data received from circuit block 903. Such signals may differentially encode one or more bits such that a difference between the respective voltage levels of wires 908A and 908B, at a particular point in time, correspond to a particular bit value. In some cases, the generation of the signals may include encoding the bits prior to transmission. It is noted that although communication bus 907 is depicted as including two wires, in other embodiments, any suitable number of wires may be employed.

Device 902 includes receiver circuit 905 and circuit block 906. Like device 901, device 902 may be a processor circuit, a processor core, a memory circuit, or any other suitable circuit block configured to receive data from transmitter circuit 904. In various embodiments, receiver circuit 905 may correspond to receiver circuit 100 as depicted in FIG. 1.

Devices 901 and 902 may, in some embodiments, be fabricated on a common integrated circuit. In other embodiments, devices 901 and 902 may be located on different integrated circuits mounted on a common substrate or circuit board. In such cases, communication bus 907 may include metal or other conductive traces on the substrate or circuit board. Although only two devices are depicted in computer system 900, in other embodiments, any suitable number of devices may be employed.

Figure 10:
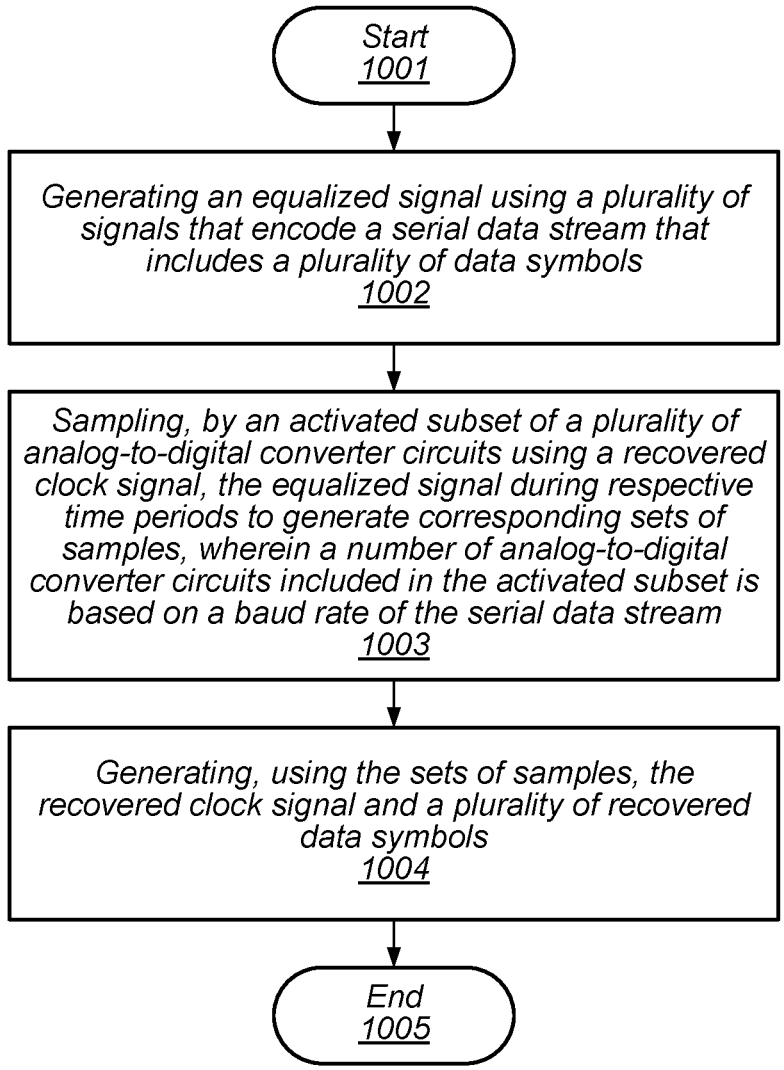
FIG. 10 is a flow diagram of an embodiment of a method for interleaving analog-to-digital converter circuits in a receiver circuit.

Turning to FIG. 10, a flow diagram depicting an embodiment of a method for operating a serial data receiver circuit is illustrated. The method, which may be applied to various receiver circuits including receiver circuit 100, begins in block 1001.

The method includes generating an equalized signal using a plurality of signals that encode a serial data stream that includes a plurality of data symbols (block 1002). In some cases, the plurality of signals may encode the serial data stream as a difference in the respective voltage levels of the plurality of signals. Alternatively, individual data symbols in the serial data stream may be encoded using the amplitude of one or more of the plurality of signals. It is noted that a data symbol may correspond to a single bit or multiple bits. In some embodiments, generating the equalized signal includes filtering the plurality of signals to generate a filtered signal, and adjusting a magnitude of the filtered signal to generate the equalized signal.

The method further includes sampling, by an activated subset of a plurality of analog-to-digital converter circuits using a recovered clock signal, the equalized signal during respective time periods to generate corresponding sets of samples, where a number of analog-to-digital converter circuits included in the activated subset is based on a baud rate of the serial data stream (block 1003).

In various embodiments, the method may also include combining, based on the baud rate of the serial data stream, the corresponding sets of samples to generate serialized data. In such cases, the method may further include generating the recovered clock signal and the recovered data symbols using the serialized data.

In some embodiments, sampling the equalized data includes sampling, using respective ones of a plurality of sample clock signals, the equalized signal to generate the corresponding sets of samples. The plurality of sample clock signals can be based on the recovered clock signal. It is noted that in various embodiments, a given sample included in a particular set of the sets of samples is aligned with a corresponding one of the plurality of sample clock signals.

In other embodiments, sampling the equalized signal includes sampling, by a plurality of buffer circuits using corresponding ones of a plurality of buffer clock signals, the equalized signal to generate a corresponding plurality of buffered samples. The method may also include quantizing, by the subset of the plurality of analog-to-digital converter circuits, respective ones of the plurality of buffered samples to generate the corresponding sets of samples.

In various embodiments, the method may further include generating a plurality of re-timed samples using the corresponding sets of samples and a different clock signal. In such cases, a frequency of the different clock signal is different than respective frequencies of the plurality of sample clock signals.

The method also includes generating, using the sets of samples, the recovered clock signal and a plurality of recovered data symbols (block 1004). In some embodiments, generating the plurality of recovered data symbols includes performing a feed-forward equalization operation using the sets of samples. The method concludes in block 1005.

Figure 11:
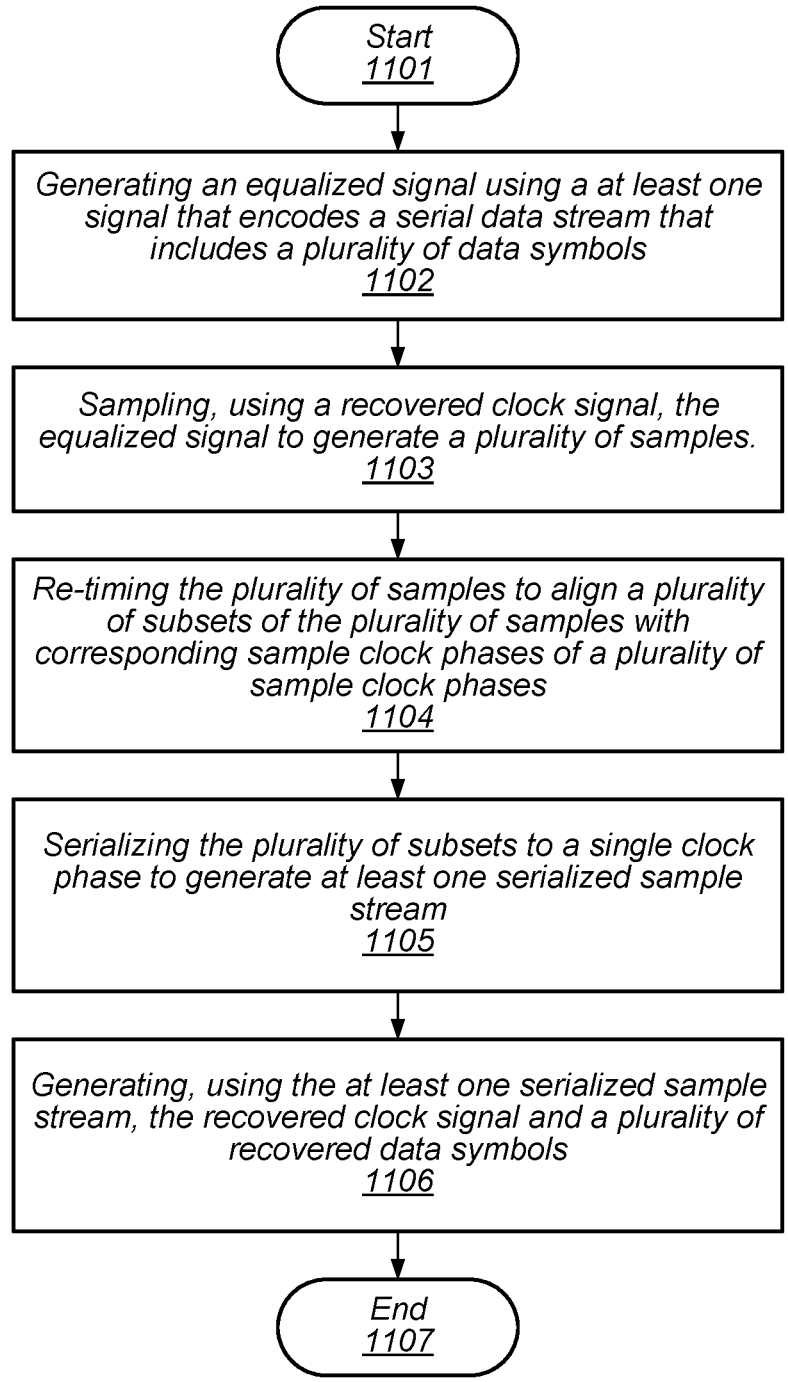
FIG. 11 is a flow diagram of an embodiment of a method for scaling serialization in a receiver circuit that employs multiple analog-to-digital converter circuits.

As described above, serialization may be employed on data generated by an analog-to-digital converter circuit used to sample a data stream. An embodiment of a method for employing such serialization is depicted in the flow diagram of FIG. 11. The method, which may be applied to receiver circuit 200, begins in block 1101.

The method includes generating an equalized signal using at least one signal that encodes a serial data stream that includes a plurality of data symbols (block 1102). In some cases, the plurality of signals may encode the serial data stream as a difference in the respective voltage levels of the plurality of signals. Alternatively, individual data symbols in the serial data stream may be encoded using the amplitude of one or more of the plurality of signals. It is noted that a data symbol may correspond to a single bit or multiple bits. In some embodiments, generating the equalized signal includes filtering the plurality of signals to generate a filtered signal, and adjusting a magnitude of the filtered signal to generate the equalized signal.

The method further includes, sampling, using a recovered clock signal, the equalized signal to generate a plurality of samples (block 1103). In various embodiments, sampling, by the subset of the plurality of analog-to-digital converter circuits, the equalized signal includes sampling the equalized signal by the subset of the plurality of analog-to-digital converter circuits using respective ones of a plurality of sample clocks that are out of phase with each other. In some embodiments, the method further includes generating the plurality of sample clocks using the recovered clock signal. The method also includes re-timing the plurality of samples to align a plurality of subsets of the plurality of samples with corresponding ones of the plurality of sample clock phases.

The method also includes serializing the plurality of subsets to a single clock phase to generate at least one serialized sample stream (block 1104). In some embodiments, the method may include combining a first subset of the plurality of subsets of the plurality of samples to generate a first serialized sample stream of a plurality of serialized sample streams, and combining a second subset of the plurality of subsets of the plurality of samples to generate a second serialized sample stream of the plurality of serialized sample streams. In various embodiments, a number of serialized sample streams included in the plurality of serialized sample streams is based on a baud rate of the serial data stream.

The method further includes generating, using the at least one serialized sample stream, the recovered clock signal and a plurality of recovered data symbols (block 1106). In some embodiments, generating the plurality of recovered data symbols includes performing a feed-forward equalization operation using the at least one serialized sample stream. The method concludes in block 1107.

Figure 12:
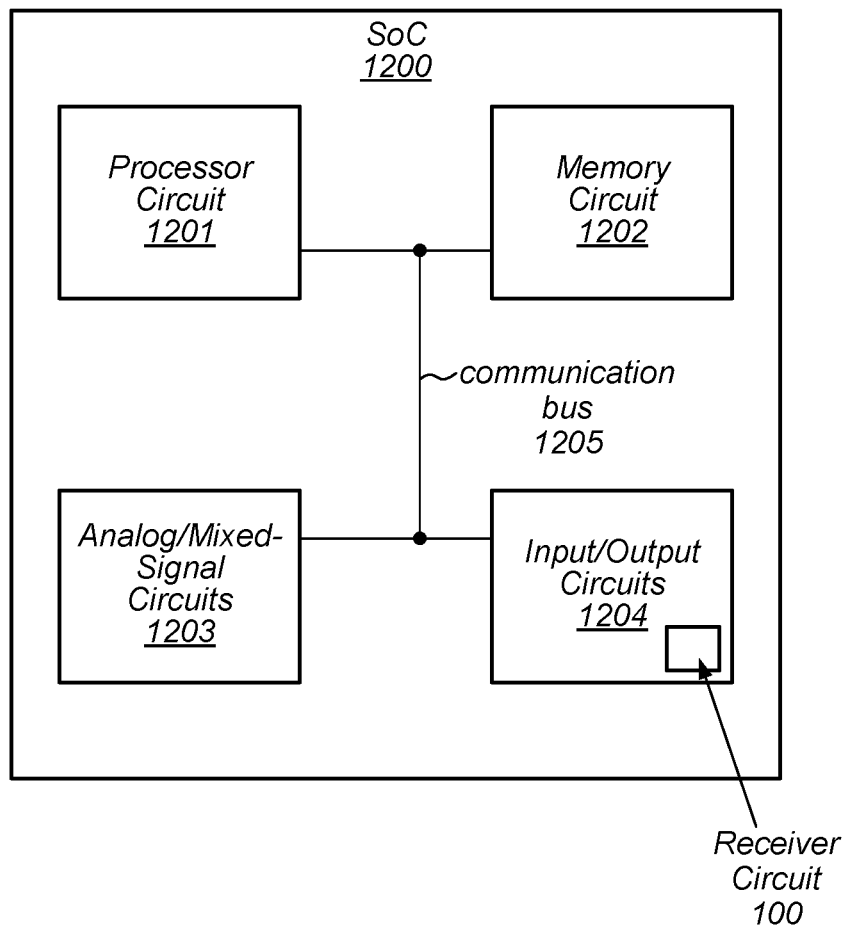
FIG. 12 is a block diagram of one embodiment of a system-on-a-chip that includes a receiver circuit.

A block diagram of a system-on-a-chip (SoC) is illustrated in FIG. 12. In the illustrated embodiment, SoC 1200 includes processor circuit 1201, memory circuit 1202, analog/mixed-signal circuits 1203, and input/output circuits 1204, each of which is coupled to communication bus 1205. In various embodiments, SoC 1200 may be configured for use in a desktop computer, server, or in a mobile computing application such as, e.g., a tablet, laptop computer, or wearable computing device.

Processor circuit 1201 may, in various embodiments, be representative of a general-purpose processor that performs computational operations. For example, processor circuit 1201 may be a central processing unit (CPU) such as a microprocessor, a microcontroller, an application-specific integrated circuit (ASIC), or a field-programmable gate array (FPGA).

Memory circuit 1202 may in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 12, in other embodiments, any suitable number of memory circuits may be employed.

Analog/mixed-signal circuits 1203 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1203 may be configured to perform power management tasks with the inclusion of on-chip power supplies and voltage regulators.

Input/output circuits 1204 may be configured to coordinate data transfer between SoC 1200 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1204 may be configured to implement a version of Universal Serial Bus (USB) protocol or IEEE 1394 (Firewire®) protocol, and include receiver circuit 100 as depicted in the embodiment of FIG. 1.

Input/output circuits 1204 may also be configured to coordinate data transfer between SoC 1200 and one or more devices (e.g., other computing systems or integrated circuits) coupled to SoC 1200 via a network. In one embodiment, input/output circuits 1204 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1204 may be configured to implement multiple discrete network interface ports.

Figure 13:
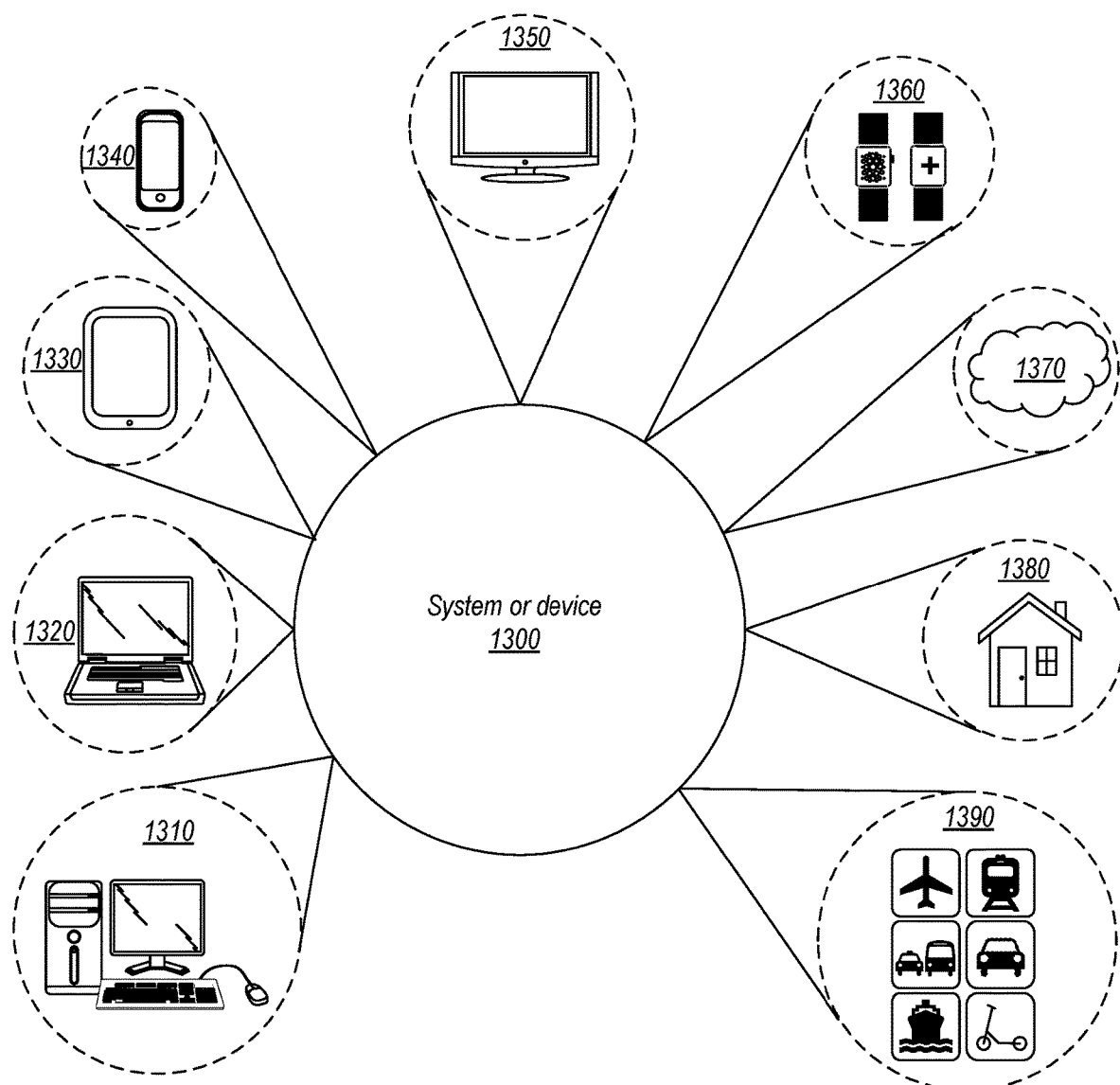
FIG. 13 is a block diagram of various embodiments of computer systems that may include receiver circuits.

Turning now to FIG. 13, various types of systems that may include any of the circuits, devices, or systems discussed above are illustrated. System or device 1300, which may incorporate or otherwise utilize one or more of the techniques described herein, may be utilized in a wide range of areas. For example, system or device 1300 may be utilized as part of the hardware of systems such as a desktop computer 1310, laptop computer 1320, tablet computer 1330, cellular or mobile phone 1340, or television 1350 (or set-top box coupled to a television).

Similarly, disclosed elements may be utilized in a wearable device 1360, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1300 may also be used in various other contexts. For example, system or device 1300 may be utilized in the context of a server computer system, such as a dedicated server or on shared hardware that implements a cloud-based service 1370. Still further, system or device 1300 may be implemented in a wide range of specialized everyday devices, including devices 1380 commonly found in the home such as refrigerators, thermostats, security cameras, etc. The interconnection of such devices is often referred to as the "Internet of Things" (IoT). Elements may also be implemented in various modes of transportation. For example, system or device 1300 could be employed in the control systems, guidance systems, entertainment systems, etc. of various types of vehicles 1390.

The applications illustrated in FIG. 13 are merely exemplary and are not intended to limit the potential future applications of disclosed systems or devices. Other example applications include, without limitation: portable gaming devices, music players, data storage devices, unmanned aerial vehicles, etc.

Figure 14:
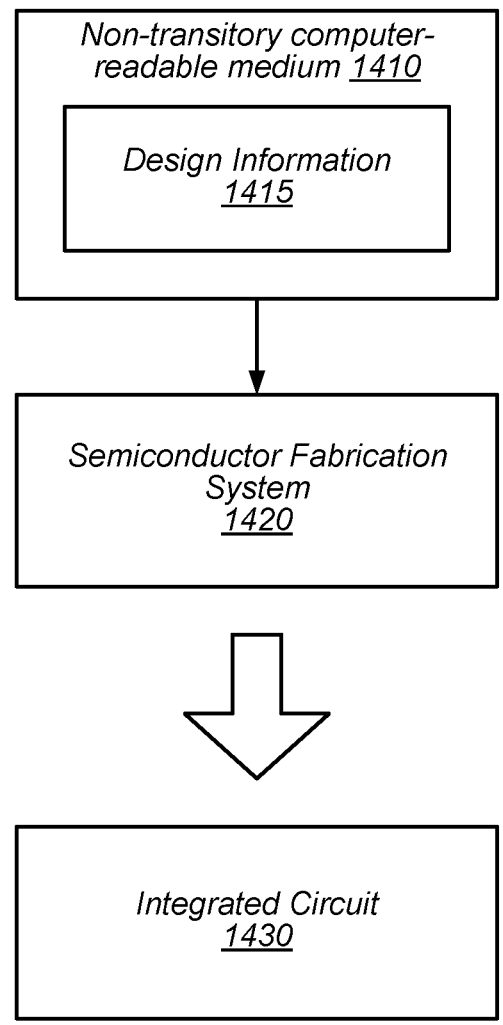
FIG. 14 illustrates an example of a non-transitory computer-readable storage medium that stores circuit design information.

FIG. 14 is a block diagram illustrating an example of a non-transitory computer-readable storage medium that stores circuit design information, according to some embodiments. In the illustrated embodiment, semiconductor fabrication system 1420 is configured to process the design information 1415 stored on non-transitory computer-readable storage medium 1410 and fabricate integrated circuit 1430 based on the design information 1415.

Non-transitory computer-readable storage medium 1410 may comprise any of various appropriate types of memory devices or storage devices. Non-transitory computer-readable storage medium 1410 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1410 may include other types of non-transitory memory as well or combinations thereof. Non-transitory computer-readable storage medium 1410 may include two or more memory mediums, which may reside in different locations, e.g., in different computer systems that are connected over a network.

Design information 1415 may be specified using any of various appropriate computer languages, including hardware description languages such as, without limitation: VHDL, Verilog, SystemC, SystemVerilog, RHDL, M, MyHDL, etc. Design information 1415 may be usable by semiconductor fabrication system 1420 to fabricate at least a portion of integrated circuit 1430. The format of design information 1415 may be recognized by at least one semiconductor fabrication system, such as semiconductor fabrication system 1420, for example. In some embodiments, design information 1415 may include a netlist that specifies elements of a cell library, as well as their connectivity. One or more cell libraries used during logic synthesis of circuits included in integrated circuit 1430 may also be included in design information 1415. Such cell libraries may include information indicative of device or transistor level netlists, mask design data, characterization data, and the like, of cells included in the cell library.

Integrated circuit 1430 may, in various embodiments, include one or more custom macrocells, such as memories, analog or mixed-signal circuits, and the like. In such cases, design information 1415 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1420 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1420 may also be configured to perform various testing of fabricated circuits for correct operation.

In various embodiments, integrated circuit 1430 is configured to operate according to a circuit design specified by design information 1415, which may include performing any of the functionality described herein. For example, integrated circuit 1430 may include any of various elements shown or described herein. Further, integrated circuit 1430 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U. S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a front-end circuit configured to generate an equalized signal using a plurality of signals that encode a serial data stream that includes a plurality of data symbols;
   a sample circuit including a plurality of analog-to-digital converter circuits, wherein an activated subset of the plurality of analog-to-digital converter circuits are configured to sample, using a recovered clock signal, the equalized signal during respective time periods to generate corresponding sets of samples, wherein a number of analog-to-digital converter circuits included in the activated subset is based on a baud rate of the serial data stream, wherein the sample circuit is configured to generate a plurality of serialized sample streams that include samples from respective subsets of the activated subset of the plurality of analog-to-digital converter circuits, wherein a first serialized sample stream of the plurality of serialized sample streams includes first data corresponding to even-numbered data symbols of the plurality of data symbols, and wherein a second serialized sample stream of the plurality of serialized sample streams includes second data corresponding to odd-numbered data symbols of the plurality of data symbols; and
   a recovery circuit configured to generate, using the corresponding sets of samples, the recovered clock signal and a plurality of recovered data symbols.

2. The apparatus of claim 1, wherein the plurality of analog-to-digital converter circuits are further configured to sample, using respective ones of a plurality of sample clock signals, the equalized signal to generate the corresponding sets of samples, wherein the plurality of sample clock signals are based on the recovered clock signal, and wherein a given sample included in a particular set of samples is aligned with a corresponding one of the plurality of sample clock signals.

3. The apparatus of claim 2, wherein the sample circuit is further configured to generate the plurality of sample clock signals using the recovered clock signal.

4. The apparatus of claim 3, further comprising a re-timer circuit configured to generate a plurality of re-timed samples using the corresponding sets of samples and a different clock signal, wherein a frequency of the different clock signal is different than respective frequencies of the plurality of sample clock signals.

5. The apparatus of claim 1, wherein the sample circuit further includes a plurality of buffer circuits configured to sample, based on corresponding ones of a plurality of buffer clock signals, the equalized signal to generate a corresponding plurality of buffered samples, and wherein the subset of the plurality of analog-to-digital converter circuits are configured to quantize respective ones of the corresponding plurality of buffered samples to generate the corresponding sets of samples.

6. The apparatus of claim 1, wherein to generate the equalized signal, the front-end circuit is further configured to:
   filter the plurality of signals to generate a filtered signal; and
   adjust a magnitude of the filtered signal to generate the equalized signal.

7. A method, comprising:
   generating an equalized signal using a plurality of signals that encode a serial data stream that includes a plurality of data symbols;
   sampling, by an activated subset of a plurality of analog-to-digital converter circuits using a recovered clock signal, the equalized signal during respective time periods to generate corresponding sets of samples, wherein a number of analog-to-digital converter circuits included in the activated subset is based on a baud rate of the serial data stream;
   generating a plurality of serialized sample streams that include samples from respective subsets of the activated subset of the plurality of analog-to-digital converter circuits, wherein a first serialized sample stream of the plurality of serialized sample streams includes first data corresponding to even-numbered data symbols of the plurality of data symbols, and wherein a second serialized sample stream of the plurality of serialized sample streams includes second data corresponding to odd-numbered data symbols of the plurality of data symbols; and generating, using the plurality of serialized sample streams, the recovered clock signal and a plurality of recovered data symbols.

8. The method of claim 7, wherein sampling the equalized signal includes sampling, using respective ones of a plurality of sample clock signals, the equalized signal to generate the corresponding sets of samples, wherein the plurality of sample clock signals are based on the recovered clock signal, and wherein a given sample included in a particular set of the corresponding sets of samples is aligned with a corresponding one of the plurality of sample clock signals.

9. The method of claim 8, further comprising, generating the plurality of sample clock signals using the recovered clock signal.

10. The method of claim 9, further comprising, generating a plurality of re-timed samples using the corresponding sets of samples and a different clock signal, wherein a frequency of the different clock signal is different than respective frequencies of the plurality of sample clock signals.

11. The method of claim 10, wherein sampling the equalized signal includes:
sampling, by a plurality of buffer circuits using corresponding ones of a plurality of buffer clock signals, the equalized signal to generate a corresponding plurality of buffered samples; and
quantizing, by the subset of the plurality of analog-to-digital converters circuits, respective ones of the corresponding plurality of buffered samples to generate the corresponding sets of samples.

12. The method of claim 10, wherein generating the plurality of recovered data symbols includes performing a feed-forward equalization operation using the corresponding sets of samples.

13. The method of claim 7, wherein generating the equalized signal includes:
filtering the plurality of signals to generate a filtered signal; and
adjusting a magnitude of the filtered signal to generate the equalized signal.

14. An apparatus, comprising:
a front-end circuit configured to generate an equalized signal using at least one signal that encodes a serial data stream that includes a plurality of data symbols;

a sample circuit configured to:
sample, using a recovered clock signal, the equalized signal to generate a plurality of samples; and
re-time the plurality of samples to align a plurality of subsets of the plurality of samples with corresponding sample clock phases of a plurality of sample clock phases;
a serializer circuit configured to generate a plurality of serialized sample streams that include respective ones of the plurality of subsets of the plurality of samples, wherein a first serialized sample stream of the plurality of serialized sample streams includes first data corresponding to even-numbered data symbols of the plurality of data symbols, and wherein a second serialized sample stream of the plurality of serialized sample streams includes second data corresponding to odd-numbered data symbols of the plurality of data symbols; and
a recovery circuit configured to generate, using the plurality of serialized sample streams, the recovered clock signal and a plurality of recovered data symbols.

15. The apparatus of claim 14, wherein the sample circuit includes a plurality of analog-to-digital converters circuits configured to sample, using a plurality of sample clock phases, the equalized signal during respective time periods, wherein a given analog-to-digital converter circuit of the plurality of analog-to-digital converters circuits is configured to generate a corresponding subset of the plurality of subsets of the plurality of samples.

16. The apparatus of claim 15, wherein the sample circuit is further configured to generate the plurality of sample clock phases using the recovered clock signal.

17. The apparatus of claim 14, wherein a number of serialized symbol streams is based on a baud rate of the serial data stream.

18. The apparatus of claim 14, wherein to generate the equalized signal, the front-end circuit is further configured to:
filter the at least one signal to generate a filtered signal; and
adjust a magnitude of the filtered signal to generate the equalized signal.

19. The apparatus of claim 14, wherein to generate the plurality of recovered data symbols, the recovery circuit is further configured to perform a feed-forward equalization operation using the plurality of serialized sample streams.

* * * * *